(12) United States Patent
Hoshino et al.

(10) Patent No.: US 12,379,667 B2
(45) Date of Patent: Aug. 5, 2025

(54) EXPOSURE APPARATUS, EXPOSURE METHOD, AND MANUFACTURING METHOD FOR SEMICONDUCTOR DEVICE

(71) Applicant: CANON KABUSHIKI KAISHA, Tokyo (JP)

(72) Inventors: Rika Hoshino, Tochigi (JP); Kazuhiro Takahashi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 516 days.

(21) Appl. No.: 17/934,512

(22) Filed: Sep. 22, 2022

(65) Prior Publication Data

US 2023/0101647 A1 Mar. 30, 2023

(30) Foreign Application Priority Data

Sep. 28, 2021 (JP) ................................. 2021-157909

(51) Int. Cl.
*G03F 7/00* (2006.01)
*G02B 27/09* (2006.01)
*H01L 21/027* (2006.01)

(52) U.S. Cl.
CPC ..... *G03F 7/70575* (2013.01); *G02B 27/0988* (2013.01); *G03F 7/7005* (2013.01); *H01L 21/027* (2013.01)

(58) Field of Classification Search
CPC ............... G03F 7/7005; G03F 7/70333; G03F 7/70575; G03F 7/7055; G03F 7/7015; G03F 7/70358; G03F 7/70783; G02B 27/0988; H01L 21/027; H01L 21/0274; H01L 21/308; H01F 39/026; H01F 39/807

See application file for complete search history.

(56) References Cited

U.S. PATENT DOCUMENTS

2022/0066326 A1 * 3/2022 Takahashi .......... G02B 27/0075

FOREIGN PATENT DOCUMENTS

| EP | 4050416 A1 * | 8/2022 | ......... G03F 7/70041 |
| JP | S6477123 A | 3/1989 | |
| JP | H07153658 A | 6/1995 | |
| KR | 20200049528 A | 5/2020 | |

* cited by examiner

*Primary Examiner* — Peter B Kim
(74) *Attorney, Agent, or Firm* — Canon U.S.A., Inc. IP Division (57) ABSTRACT

An exposure apparatus, which is configured to expose a substrate to light using an original in which a pattern is formed, includes an illumination optical system configured to guide exposure light to the original, the exposure light including first exposure light with a first wavelength and second exposure light with a second wavelength that is different from the first wavelength, an optical projection system that exhibits on-axis chromatic aberration and that is configured to form a pattern image of the original at a plurality of positions in an optical axis direction of the optical projection system using the exposure light, and a control unit configured to expose the substrate to light while scanning the substrate in a state where a normal direction of a surface of the substrate is inclined with respect to the optical axis direction of the optical projection system.

12 Claims, 8 Drawing Sheets

EXPOSURE APPARATUS, EXPOSURE METHOD, AND MANUFACTURING METHOD FOR SEMICONDUCTOR DEVICE

BACKGROUND OF THE INVENTION

Field of the Invention

The present disclosure relates to an exposure apparatus, an exposure method, and a manufacturing method for a semiconductor device.

Description of the Related Art

In manufacturing of a product such as a semiconductor device, used is an exposure apparatus that causes an illumination optical system to illuminate an original (reticle or mask) and projects a pattern of the original onto a substrate via a projection optical system to expose the substrate to light. In the exposure apparatus, a pattern image of the original is formed on a resist arranged on the substrate and thereafter etching processing or the like is performed, whereby a desired pattern is formed on the substrate.

A required thickness of the resist is different depending on a manufacturing method for a device, and a process in which a resist is required to be thick is called a thick film process in some cases. In this thick film process, extension of a focal depth of the projection optical system included in the exposure apparatus is demanded to form the pattern image in the resist with high accuracy.

Japanese Patent Application Laid-Open No. Sho 64-77123 discusses contents regarding multi-wavelength exposure to perform exposure by causing a light source such as an excimer laser to emit light that oscillates with two different wavelengths and thereby temporally diving the wavelengths of light from the light source into two. Due to the influence of on-axis chromatic aberration of the projection optical system, an image of a pattern can be formed at different positions in an optical axis direction of the projection optical system.

Japanese Patent Application Laid-Open No. Hei 7-153658 discusses a focus-latitude enhancement exposure (FLEX) method as a method of extending a focal depth of an exposure apparatus. The FLEX method is a method of exposing a substrate to light in a plurality of defocus states, or a method of exposing the substrate to light so that light intensities formed by the original in the vicinity of image planes of the projecting optical system overlap with each other in the optical axis direction.

In late years, a resist to be applied in the thick film process has become thicker than ever before, and further extension of the depth of focus of the projection optical system has been demanded. Therefore, there is a possibility that extension of the depth of focus by multi-wavelength exposure discussed in Japanese Patent Application Laid-Open No. Sho 64-77123 or extension of the depth of focus by the FLEX method discussed in Japanese Patent Application Laid-Open No. Hei 7-153658 is insufficient.

SUMMARY OF THE INVENTION

According to an aspect of the present disclosure, an exposure apparatus configured to expose a substrate to light using an original in which a pattern is formed, the exposure apparatus includes an illumination optical system configured to guide exposure light to the original, the exposure light including first exposure light with a first wavelength and second exposure light with a second wavelength that is different from the first wavelength, an optical projection system that exhibits on-axis chromatic aberration and that is configured to form a pattern image of the original at a plurality of positions in an optical axis direction of the optical projection system using the exposure light, and a control unit configured to expose the substrate to light while scanning the substrate in a state where a normal direction of a surface of the substrate is inclined with respect to the optical axis direction of the optical projection system, wherein the control unit is configured to adjust parameters regarding both an angle of gradient of the substrate and a difference between the first wavelength and the second wavelength so as to enable a change of a relative ratio between the angle of gradient and the difference.

Further features of the present disclosure will become apparent from the following description of exemplary embodiments with reference to the attached drawings.

DESCRIPTION OF THE EMBODIMENTS

Exemplary embodiments of the present disclosure will be described in detail below with reference to drawings. The following exemplary embodiments merely represent specific examples of implementation of the present disclosure, and the present disclosure is not limited to the following exemplary embodiments. All combinations of features described in the following exemplary embodiments are not necessarily essential to a means for solving issues of the present disclosure.

Figure 1:
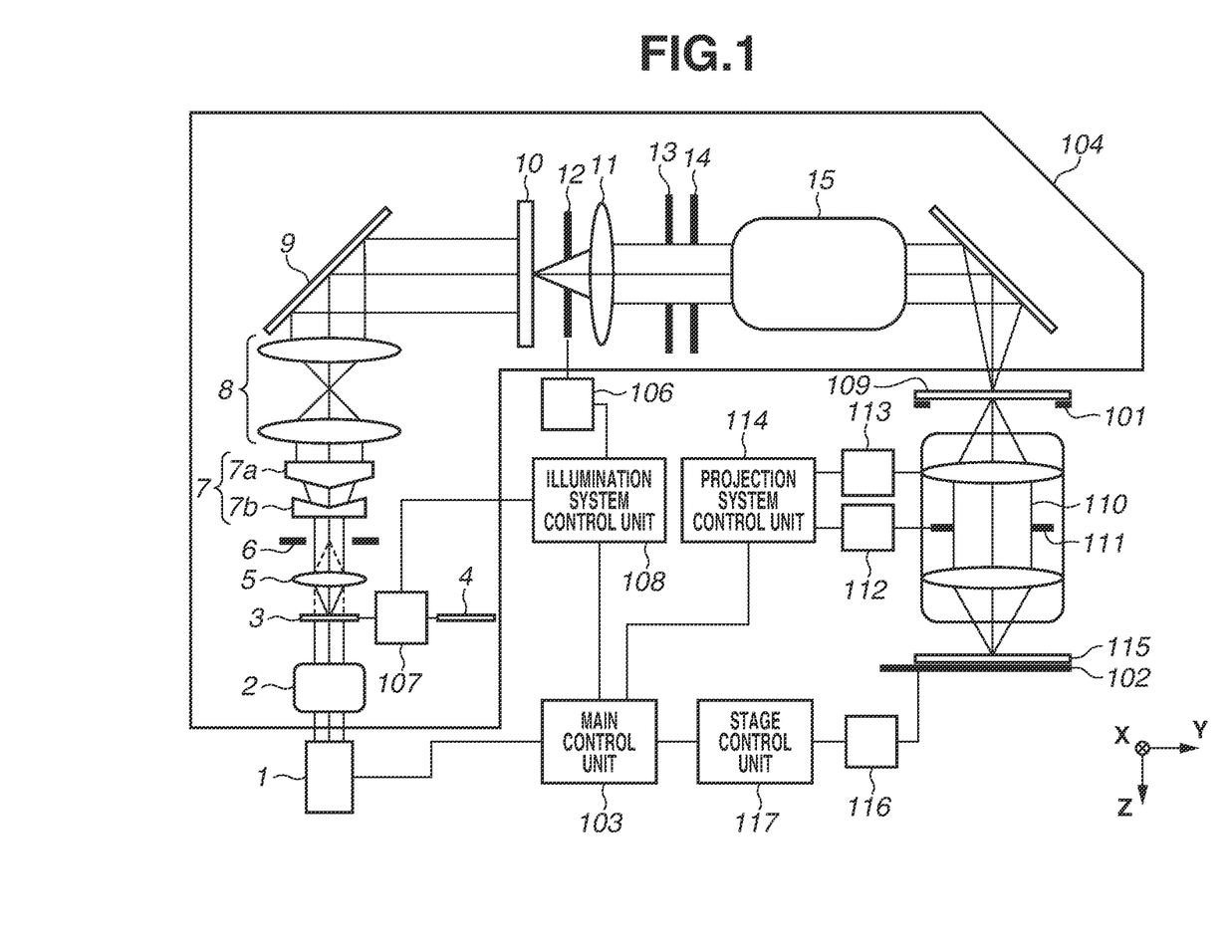
FIG. 1 is a diagram illustrating a configuration of an exposure apparatus.

FIG. 1 is a diagram illustrating a schematic configuration of an exposure apparatus according to the present exemplary embodiments. The exposure apparatus is configured to irradiate, through an illumination optical system 104, a pattern of an original (which is also called a mask or a reticle) 109 with light emitted from a light source 1, cause a projection optical system 110 to project the pattern onto a substrate 115, and thereby expose the substrate 115 to light.

In the present exemplary embodiments, a direction is defined in an XYZ orthogonal coordinate system with a horizontal plane serving as an XY plane. An axis that is parallel with an optical axis of the projection optical system 110 is a Z-axis, and axes extending in directions orthogonal to the Z-axis are X- and Y-axes. Directions that are parallel with the X-, Y-, and Z-axes are X-, Y-, and Z-directions, respectively.

The illumination optical system 104 is composed of elements arranged on an optical path extending from the light source 1 to the original 109. Examples of the light source 1 include an argon fluoride (ArF) excimer laser with an oscillation wavelength of about 193 nm and a krypton fluoride (KrF) excimer laser with an oscillation wavelength of about 248 nm, but a type of the light source 1 and a wavelength of light emitted from the light source 1 are not specifically limited. The light emitted from the light source 1 is guided by a relay optical system 2 to a diffraction optical element 3. Typically, a diffraction optical element is mounted on each of a plurality of slots included in a turret, and a driving mechanism 107 enables arrangement of a freely-selected diffraction optical element (for example, a diffraction optical element 4) on the optical path. Light emitted from the diffraction optical element 3 is collected by a condenser lens 5, and a diffraction pattern is formed on a diffraction pattern surface 6. Replacing the diffraction optical element 3 positioned on the optical path using the driving mechanism 107 can change a shape of the diffraction pattern.

The diffraction pattern formed on the diffraction pattern surface 6 is subjected to adjustment of parameters such as an annular ratio and a σ value by a prism group 7 and a zoom lens 8, and is thereafter incident on a mirror 9. A light flux reflected by the mirror 9 is incident on an optical integrator 10. The optical integrator 10 can be configured as, for example, a lens array (fly eye lens).

The prism group 7 includes, for example, a prism 7a and a prism 7b. In a case where a distance between the prism 7a and the prism 7b is sufficiently small, the prism 7a and the prism 7b can be regarded as one sheet of an integrated glass plate. Changing an interval between the prism 7a and the prism 7b can change a light intensity distribution. Specifically, the annular ratio (a ratio between an external diameter and an internal diameter) and the like can be changed as appropriate.

The diffraction pattern formed on the diffraction pattern surface 6 can be extended or reduced by the zoom lens 8 while maintaining an almost similar shape. Light that has passed through the zoom lens 8 can be formed as an image on an incident surface of the optical integrator 10. A plurality of micro lenses is two-dimensionally arranged to constitute the optical integrator 10. The light flux incident on the optical integrator 10 is divided, and a light source is formed on a back side focal plane of each micro lens.

In this manner, a virtual plane light source (secondary light source) having a light intensity distribution that is almost identical to that of an incident light flux is formed on the back side focal plane of the optical integrator 10.

A light flux emitted from the optical integrator 10 is collected by a condenser lens 11. The secondary light sources formed on the back side focal plane of the optical integrator 10 illuminates, in an overlapping manner, a field diaphragm 14 arranged at a conjugate position with the original 109 serving as a surface to be irradiated (and furthermore, the substrate 115).

The field diaphragm 14 is a diaphragm for defining an exposure range of the original 109 held by a mask stage (original stage) 101 (furthermore, the substrate 115). An exposure slit 13 for correcting uneven illuminance is arranged in the vicinity of the front side (light source side) of the field diaphragm 14, and an aperture range common to the exposure slit 13 and the field diaphragm 14 serves as the exposure range.

A field diaphragm 12 on the front side (light source side) of the condenser lens 11 includes a plurality of movable light-shielding plates. A driving mechanism 106 drives the plurality of light-shielding plates, whereby a freely-selected aperture shape is formed in the field diaphragm 12. An illumination system control unit 108 is capable of setting a diameter of the aperture shape, and, furthermore, a numerical aperture (NA) of the illumination optical system 104 to desired values. In this case, a value of a ratio of the numerical aperture of the illumination optical system 104 to the numerical aperture of the projection optical system 110, which will be described below, is a coherence factor (σ value). Thus, the illumination system control unit 108 is capable of setting the σ value by controlling the field diaphragm 12. An image-forming optical system 15 projects the aperture shape formed by the exposure slit 13 and the field diaphragm 14 onto the original 109. The projection optical system 110 projects the pattern of the original 109 at a predetermined magnification ratio (for example, one-quarter times) onto the substrate 115 held by a substrate stage 102. With this operation, the pattern is formed in a photosensitive agent on the substrate 115.

An aperture diaphragm 111 in which an aperture has a substantially circular shape is arranged on a pupil plane of the projection optical system 110, and a driving mechanism 112 controls a size of the aperture. The projection optical system 110 includes a driving mechanism 113 that changes aberration of the projection optical system 110 by moving, rotating, and/or deforming at least one of a plurality of lenses that constitutes the projection optical system 110. The driving mechanism 113 can include, for example, a mechanism that moves a lens in directions along the optical axis (Z-axis) of the projection optical system 110 and two axes (X- and Y-axes) that are perpendicular to the optical axis, and a mechanism that rotates the lens about axes that are parallel with the two axes (X-axis and Y-axis) that are perpendicular to the optical axis.

Regarding a material of an optical member that constitutes the projection optical system 110, a material that can be used is limited depending on a wavelength of exposure light emitted from the light source 1. In a case where a mercury lamp with a wavelength of about 365 nm is used as the light source 1, combining optical members made of about ten types of materials enables preferable correction on on-axis chromatic aberration, magnification chromatic aberration, and the like. Meanwhile, in a case where the excimer laser, such as the KrF excimer laser with a wavelength of about 248 nm or the ArF excimer laser with a wavelength of about 193 nm, is used as the light source 1, a material that allows exposure light from the excimer laser to pass therethrough is limited. In consideration of the transmittivity and cost of the above-mentioned excimer laser, a projection optical system is typically configured using only a quartz material in the present circumstances. In this case, since it is difficult to preferably correct chromatic aberration with the optical design of the projection optical system, an attempt has been made to reduce the influence of chromatic aberration of the projection optical system by reduction in a band width of a wavelength spectrum of a laser.

The substrate stage 102 is movable in the X-, Y-, and X-directions, and is driven by a driving mechanism 116. The driving mechanism 116 is controlled by a stage control unit 117. At the time of execution of scanning exposure, the original stage 101 and the substrate stage 102 are driven in the Y-direction in synchronization with each other, whereby scanning exposure is performed. The substrate stage 102 can hold the substrate 115 in a state of being inclined with respect to the XY plane.

A main control unit 103 collectively controls the illumination system control unit 108, a projection system control unit 114, the stage control unit 117, and the like. The main control unit 103 includes a memory that stores a program and data, and executes a control program stored in the memory to execute an exposure operation.

The illumination system control unit 108 controls driving of the driving mechanism 107 and the driving mechanism 106. The projection system control unit 114 controls driving of the driving mechanism 112 and the driving mechanism 113. The stage control unit 117 controls driving of the driving mechanism 116.

In late years, in a manufacturing process for a three-dimensional memory and an image pickup element, formation of a penetrating pattern with a thickness of several micrometers to several tens of micrometers has been demanded. To form such a thick penetrating pattern by the exposure apparatus, extension of the focal depth of the projection optical system 110 is demanded. As a technique of virtually extending the focal depth, known is a method of performing multi-exposure while shifting a focal position in the optical axis direction of the projection optical system 110. As an example of multi-exposure, a focus-latitude enhancement exposure (FLEX) method has been known.

In the scanning FLEX method (hereinafter referred to as the FLEX method), scanning exposure is performed, for example, with the substrate being inclined with respect to the optical axis of the projection optical system 110 so that each point of an area on the substrate is exposed to light in two or more focus states. As another example of multi-exposure, a resolution enhancement by a laser-spectrum adjusted exposure (RELAX) method (multi-wavelength exposure method) has been known. In the RELAX method, a wavelength spectrum of a laser light source is adjusted so that there are peaks of light quantities in a plurality of wavelengths. Light with a different wavelength is formed as an image at a different position in the optical axis direction of the projection optical system 110 due to the influence of on-axis chromatic aberration remaining in the projection optical system 110. Adjusting the wavelength spectrum of the laser light source can change an image forming position in the optical axis direction, and consequently, enables obtaining of an effect of extending the focal depth.

In this manner, the technique of extending the focal depth by the FLEX method or the RELAX method has been known. However, formation of a penetrating pattern that is thicker than ever has been demanded, and it cannot be said that the extension of the focal depth is sufficient. To address this, in the present exemplary embodiments, an attempt has been made to further extend the focal depth by combining the FLEX method and the RELAX method.

Figure 2:
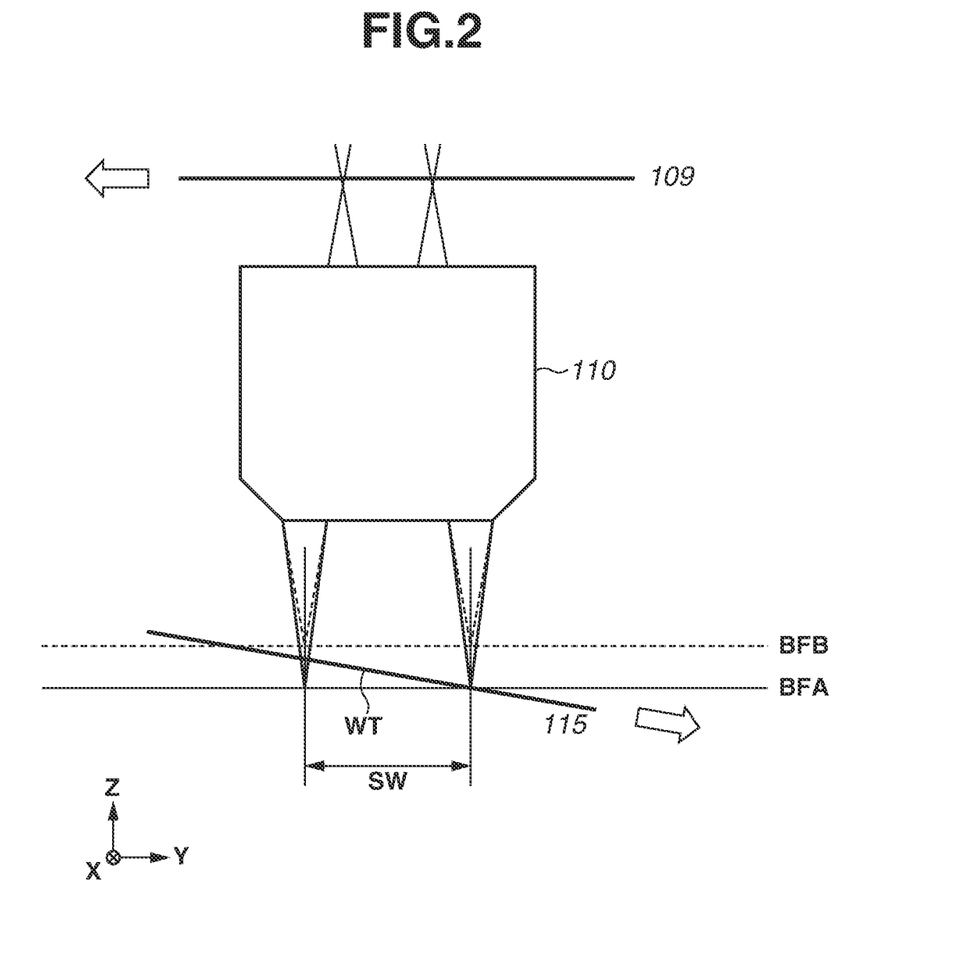
FIG. 2 is a schematic diagram illustrating scanning exposure that combines a scanning focus-latitude enhancement exposure (FLEX) method and a multi-wavelength exposure method.

FIG. 2 is a diagram illustrating a state where scanning exposure that combines the FLEX method and the RELAX method is performed. The main control unit 103 controls exposure of the substrate 115 so as to perform scanning exposure of the substrate 115 in a state where a normal direction of a surface of the substrate 115 is inclined with respect to the optical axis of the projection optical system 110 (in parallel with the Z-axis). In FIG. 2, the substrate 115 is inclined by an angle WT with respect to a plane of the projection optical system 110 that is perpendicular to the optical axis direction (XY plane). The stage control unit 117 controls driving of the substrate stage 102, whereby the substrate 115 is scanned in a direction of an arrow in FIG. 2. Exposure light incident on the substrate 115 is defined by the exposure slit 13 and the field diaphragm 14. In FIG. 2, SW represents a range of exposure light that is incident on the substrate 115.

The substrate 115 is scanned in a scanning direction (Y-direction) along the plane that is inclined about the X-axis with respect to the XY plane. Assuming that SW represents a width of exposure light emitted toward the substrate 115 in the scanning direction (Y-direction), one point in a shot area of the substrate 115 is subjected to scanning exposure in a period during which the substrate 115 moves between two points that are separate from each other by SW in the Y-direction. At this time, the above-mentioned one point is exposed to light while moving over two different defocus planes of the projection optical system 110.

In other words, in scanning exposure to which the FLEX method is applied, a freely-selected point in the shot area of the substrate 115 passes a position in a first focus state (or a first defocus state) and a position in a second focus state (or a second defocus state). A distance $\Delta F\_f$ in the optical axis direction of the projection optical system 110 between the position of the freely-selected point in the first focus state (first defocus state) and the position of the freely-selected point in the second focus state (second defocus state) is a range of a defocus amount at the freely-selected point. The distance $\Delta F\_f$ is a distance or an amount that contributes to extension of the focal depth according to the FLEX method, and is also called a FLEX amount.

In FIG. 2, the substrate 115 is subjected to scanning exposure in the state where the normal direction of the surface of the substrate 115 is inclined with respect to the optical axis direction of the projection optical system 110 (in parallel with the Z-axis). In this processing, the substrate 115 may be subjected to scanning exposure in a state where a normal direction of a surface of the original 109 is inclined with respect to the optical axis direction of the projection optical system 110 (in parallel with the Z-axis).

FIG. 2 illustrates a state where exposure light that has passed through the original 109 passes through the projection optical system 110 and reaches the substrate 115. In a case where a plurality of peaks is included in a wavelength spectrum of exposure light coming from the original 109, a light flux that is emitted from an identical object point is different in image forming position depending on a wavelength. Assume that the wavelength spectrum has a peak in a first wavelength and a peak in a second wavelength that is different from the first wavelength.

Each of light with the first wavelength and light with the second wavelength can be light with a wavelength that is shifted from a reference wavelength of light that is caused to oscillate from the light source such as the excimer laser. Causing the light source such as the excimer laser to oscillate with a plurality of wavelengths different from the reference wavelength enables obtaining of a light flux with a wavelength spectrum including a plurality of peaks. One of light with the first wavelength and light with the second wavelength may be light with a wavelength that is shifted from the reference wavelength of light that is caused to oscillate from the light source, and the other thereof may be light with the reference wavelength.

A light flux with the first wavelength indicated by a solid line in FIG. 2 passes through the projection optical system 110 and is collected on a focal plane BFA. A light flux with the second wavelength indicated by a broken line in FIG. 2 passes through the projection optical system 110 and is collected on a focal plane BFB. As described above, performing scanning exposure using the light flux having peaks in the plurality of wavelengths according to the FLEX method enables further extension of the focal depth of the projection optical system 110.

Figure 3:
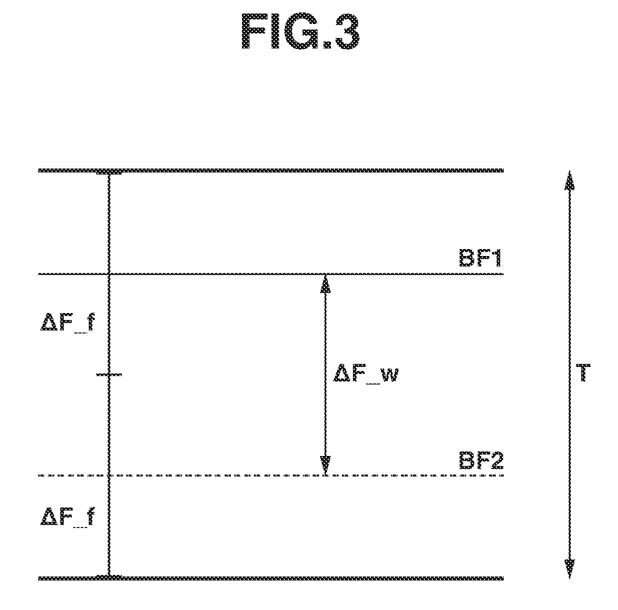
FIG. 3 is a schematic diagram illustrating a depth of focus of a projection optical system according to a first exemplary embodiment.

FIG. 3 is a schematic diagram illustrating the focal depth of the projection optical system 110 at the time of execution of the scanning exposure using the light flux having a peak in the first wavelength and a peak in the second wavelength that is different from the first wavelength according to the FLEX method. BF1 represents a best focus position of the projection optical system 110 with respect to the light flux with the first wavelength, BF2 represents a best focus position of the projection optical system 110 with respect to the light flux with the second wavelength, and $\Delta F\_w$ represents a difference between BF1 and BF2. $\Delta F\_f$ corresponds to the above-mentioned FLEX amount.

The angle of gradient WT of the substrate 115 with respect to a plane that is perpendicular to the optical axis direction of the projection optical system 110 is sufficiently small. Thus, $\Delta F\_f$ is expressed as follows using a width SW in the scanning direction of exposure light emitted toward the substrate 115 and the angle of gradient WT of the substrate 115 with respect to the plane that is perpendicular to the optical axis direction of the projection optical system 110.

$$\Delta F\_f = SW \times WT \quad (1)$$

In addition, $\Delta F\_w$ is expressed as $$\Delta F\_w = L \times \Delta\lambda \quad (2)$$

where L represents on-axis chromatic aberration of the projection optical system 110 and $\Delta\lambda$ represents a difference between a first wavelength $\lambda 1$ and a second wavelength $\lambda 2$.

As illustrated in FIG. 3, it is found that when $\Delta F\_f = \Delta F\_w$ is satisfied, a maximum effect of extending the focal depth of the projection optical system 110 can be obtained. That is, an effect of doubling the FLEX amount $\Delta F\_f$ is obtained from the Expressions (1) and (2) when a relation of $SW \times WT = L \times \Delta\lambda$ holds.

As a specific example, a consideration will be given to a case where a pattern of the original 109 is transferred with sufficient resolving power in a range in which a thickness of a resist (photosensitive agent) arranged on the substrate 115 is T=12 μm. At this time, various kinds of parameters are set so as to satisfy the following conditional expression.

$$2 \times \Delta F\_f = T \quad (3)$$

Since T=12 μm, a relation of $\Delta F\_f = 6$ μm holds. Scanning exposure that combines the FLEX method and the RELAX method is performed on a condition that $SW \times WT = L \times \Delta\lambda = 6$ μm is satisfied.

It is difficult to change the width SW in the scanning direction of exposure light emitted toward the substrate 115 and on-axis chromatic aberration L of the projection optical system 110. Thus, the angle of gradient WT of the substrate 115 with respect to the plane that is perpendicular to the optical axis direction of the projection optical system 110 and the difference $\Delta\lambda$ between the first wavelength $\lambda 1$ and the second wavelength $\lambda 2$ are adjusted. Assuming SW=8 mm and L=0.2 μm/pm, relations of WT=750 μrad and $\Delta\lambda = 30$ pm hold.

In the present exemplary embodiment, a relation of $(SW \times WT)/(\Delta\lambda \times L) = 1$ holds.

In a case where a value of WT or $\Delta\lambda$ is too large, exposure light in a wavelength spectrum having light quantity peaks in wavelengths other than the first wavelength $\lambda 1$ and the second wavelength $\lambda 2$ may be used. The number of peak wavelengths is not limited to three, and may be four or more. When the number of peak wavelengths is three or more, an interval (wavelength pitch) $\Delta\lambda$ between adjacent peak wavelengths is a constant value. For example, causing the light source such as the excimer laser to emit light that oscillates with four wavelengths that are different from the reference wavelength enables obtaining of a light flux with a wavelength spectrum including four peaks. Not all of the four wavelengths need not be differentiated from the reference wavelength, and part of exposure light may serve as light with the reference wavelength.

Figure 4:
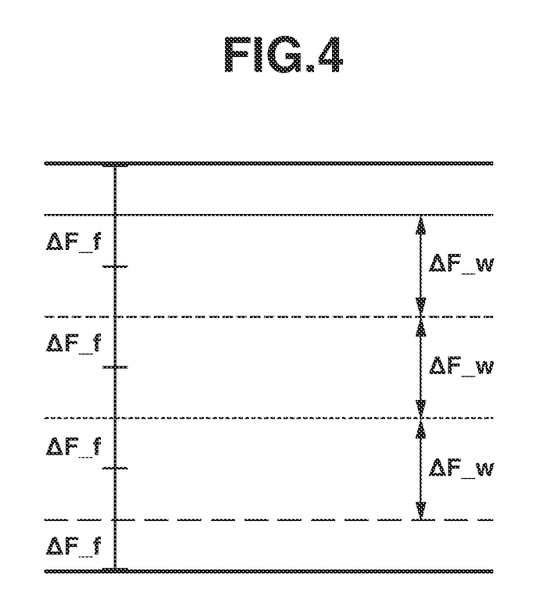
FIG. 4 is a schematic diagram illustrating a depth of focus of the projection optical system according to the first exemplary embodiment.

FIG. 4 is a schematic diagram illustrating the focal depth of the projection optical system 110 when scanning exposure according to the FLEX method using a light flux having four wavelength peaks is performed.

When this case is applied to the above-mentioned example, the various kinds of parameters are set so as to satisfy a conditional expression of $4 \times \Delta F\_f = T$. In this case, $\Delta F\_f = 3$ μm. Assuming SW=8 mm and L=0.2 μm/pm, relations of WT=375 μrad and $\Delta\lambda = 15$ pm hold.

As described above, using exposure light having N wavelength peaks at the wavelength pitch $\Delta\lambda$ enables obtaining of the effect of extending the focal depth that is equivalent to that when $\Delta F\_f$ is extended by N times in the scanning FLEX. When a thick-film resist arranged on the substrate 115 is exposed to light, it is the most effective to perform exposure so that $N \times \Delta F\_f$ that is extended by N times is matched with a thickness T of the resist. That is, a relation of $N \times \Delta F\_f = T$ holds.

Figure 5:
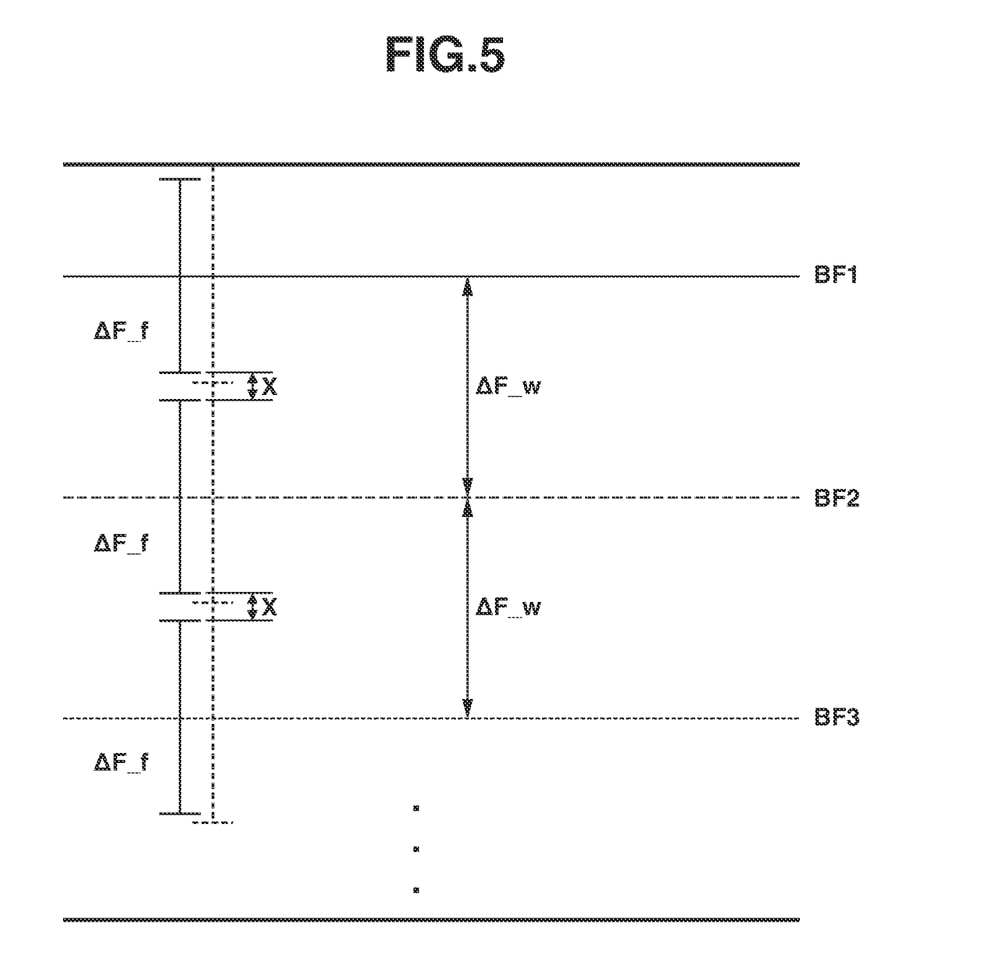
FIG. 5 is a schematic diagram illustrating a depth of focus of the projection optical system according to a second exemplary embodiment.

Since the focal depth of the projection optical system 110 is relatively large when the numerical aperture NA of the projection optical system 110 is relatively small, it is preferable the above-mentioned parameters be set in consideration of the focal depth. FIG. 5 is a schematic diagram illustrating the focal depth of the projection optical system 110 when scanning exposure according to the FLEX method is performed on a condition in a second exemplary embodiment.

In FIG. 5, various parameters are set to satisfy $$\Delta F\_f + X = \Delta F\_w \quad (4)$$

where X represents the focal depth of the projection optical system 110.

For example, when X=1 μm, the following relation holds.

$$\Delta F\_f + 1 = \Delta F\_w \quad (5)$$

As a specific example, a description will be given of a case where the pattern of the original 109 is transferred with sufficient resolving power assuming the thickness T of the resist (photosensitive agent) arranged on the substrate 115 to be 12 μm and using exposure light that oscillates with two different wavelengths that are different from the reference wavelength. At this time, the various kinds of parameters are set so as to satisfy the following condition.

$$2 \times (\Delta F\_f + 1) = T \quad (6)$$

Since T=12 μm, a relation of $(\Delta SW \times WT + 1) = 6$ μm holds. Scanning exposure that combines the FLEX method and the RELAX method is performed on a condition that $SW \times WT + 1 = L \times \Delta\lambda = 6$ μm is satisfied.

Similarly to the first exemplary embodiment, assuming SW=8 mm and L=0.2 μm/pm, relations of WT=625 μrad and $\Delta\lambda = 30$ pm hold.

In the present exemplary embodiment, a relation of $(SW \times WT)/(\Delta\lambda \times L) = 5/6$ holds.

In consideration of a focal depth that can be taken by the projection optical system 110 depending on various process conditions, it is preferable that the various kinds of parameters be set to satisfy the following relation.

$$0.5 \leq (SW \times WT)/(\Delta\lambda \times L) \quad (7)$$

Figure 6:
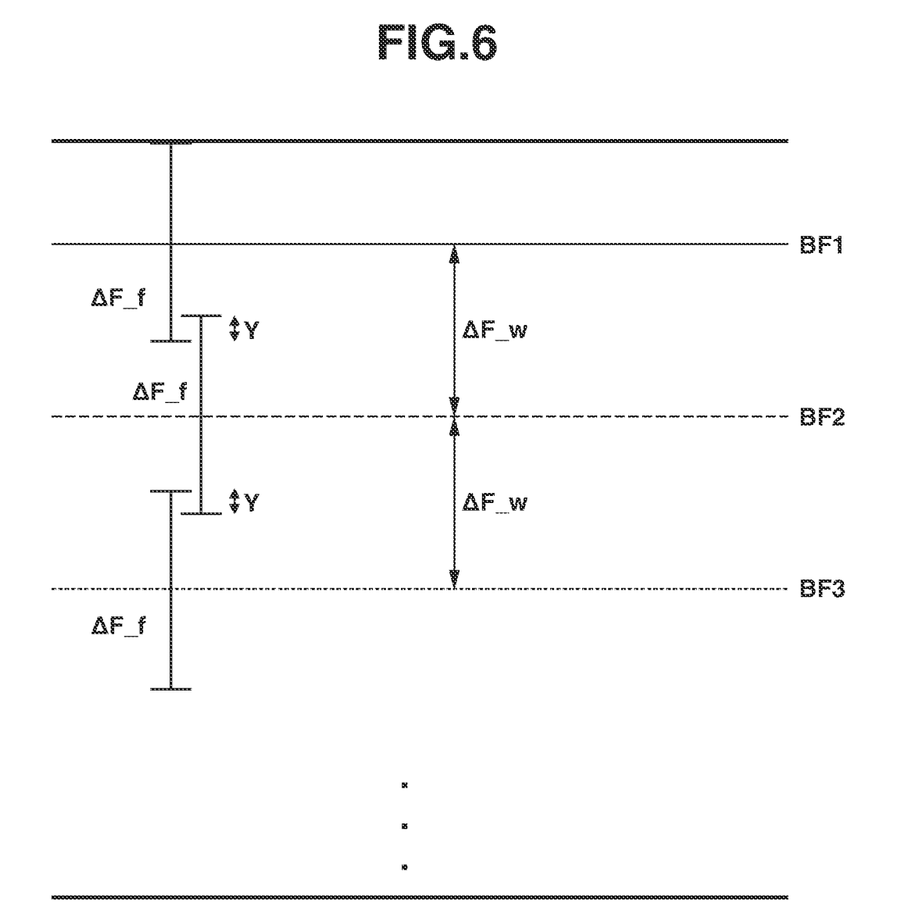
FIG. 6 is a schematic diagram illustrating a depth of focus of the projection optical system according to a third exemplary embodiment.
Figure 7:
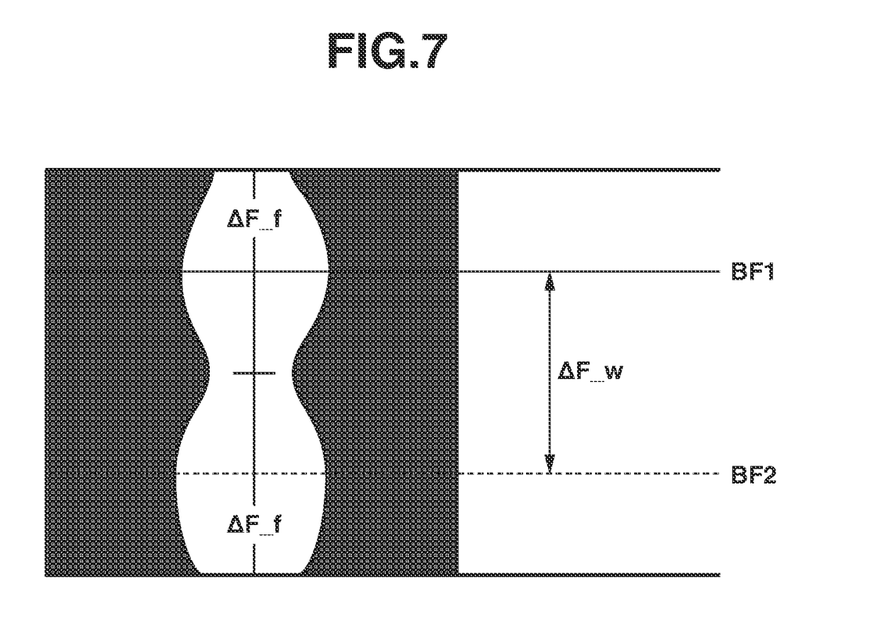
FIG. 7 is a diagram illustrating a cross-section profile of a pattern formed in a resist.

FIG. 7 is a diagram illustrating a cross-section profile shape of the pattern formed in the resist. In a case where exposure sensitivity of the resist is relatively low, sharpness of a latent image pattern formed in the resist is likely to decrease, as illustrated in FIG. 7. As illustrated in FIG. 6, it is preferable to set the above-mentioned parameters. FIG. 6 is a schematic diagram illustrating the focal depth of the projection optical system 110 when the scanning exposure according to the FLEX method is performed on a condition in a third exemplary embodiment.

The various kinds of parameters are set so as to satisfy $$\Delta F\_f = \Delta F\_w + Y \quad (8)$$

where Y represents an overlap of the flax amount $\Delta F\_f$.

For example, when Y=1 μm, the following relation holds.

$$\Delta F\_f = \Delta F\_w + 1 \quad (9)$$

As a specific example, a description will be given of a case where the pattern of the original 109 is transferred with sufficient resolving power assuming the thickness T of the resist (photosensitive agent) arranged on the substrate 115 to be 12 μm and using exposure light that oscillates with two different wavelengths that are different from the reference wavelength. At this time, the various kinds of parameters are set so as to satisfy the following conditional expression.

$$2 \times \Delta F\_f = T \quad (10)$$

Since T=12 μm, a relation of SW×WT=6 μm holds. Scanning exposure that combines the FLEX method and the RELAX method is performed on a condition that SW×WT=L×Δλ+1=6 μm is satisfied.

Similarly to the first exemplary embodiment, assuming SW=8 mm and L=0.2 μm/pm, relations of WT=750 μrad and Δλ=25 pm hold.

In the present exemplary embodiment, a relation of (SW×WT)/(Δλ×L)=6/5 holds.

In consideration of values that can be taken by various kinds of process conditions, it is preferable that the various kinds of parameters be set to satisfy the following relation.

$$(SW \times WT)/(\Delta\lambda \times L) \leq 1.5 \quad (11)$$

(Exposure Mode in Exposure Apparatus)

A manufacturing process for semiconductor devices such as a memory and an image pickup element includes a process of forming a pattern layer on a substrate. In the process, a pattern image is formed in a resist using an exposure apparatus, etching processing or the like is performed, and thereafter the pattern layer including a trench is formed. There is a case where a necessary thickness of the resist is different depending on a pattern layer to be formed, a focal depth that is necessary for a projection optical system of the exposure apparatus is also different depending on the thickness of the resist. In a case where the resist is thick, a pattern can be formed by execution of scanning exposure that combines the FLEX method and the RELAX method.

In the RELAX method, it is necessary to control an oscillation state of the laser light source so that there are light quality peaks in a plurality of wavelengths. In a case where the resist is thin, the oscillation state of the laser light source is controlled so that there is a light quantity peak in a single wavelength.

In this manner, since a condition such the thickness of the resist is different depending on a layer to be formed on the substrate, it is preferable that an exposure mode in the exposure apparatus be switchable as appropriate. For example, switching of the oscillation state of the laser light source depending on the exposure mode can be assumed. To switch the oscillation state of the laser light source, the laser light source is provided with a mechanism that is capable of switching the oscillation state. The exposure apparatus is capable of switching the oscillation state of the laser light source based on a recipe in which various kinds of parameters at the time of exposure are set.

As one example, the exposure apparatus is capable of switching the exposure mode between a first mode and a second mode. The first mode is a mode of controlling the oscillation state of the laser light source so that there is a light quantity peak in a single wavelength (reference wavelength) and performing exposure. The second mode is a mode of performing exposure using exposure light including first exposure light and second exposure light. The first exposure light has a first wavelength that is different from the reference wavelength. the second exposure light has a second wavelength that is different from the reference wavelength and the first wavelength.

When exposure based on the RELAX method is performed in the second mode, it is necessary to designate values of a plurality of wavelengths corresponding to light quantity peaks and differences in wavelengths. Thus, these parameters are only required to be one setting item of the recipe.

(Manufacturing Method for Product)

A description will be given of a manufacturing method for semiconductor devices (a memory and a photoelectric conversion device such as an image pickup element) utilizing the exposure apparatus represented by the above-mentioned exemplary embodiments. The exposure apparatus according to the present exemplary embodiments is preferably used for the manufacturing method for the semiconductor device including the thick film process. Examples of the thick film process include a process of forming a pixel separation portion of the image pickup element (photoelectric conversion device).

Figure 8:
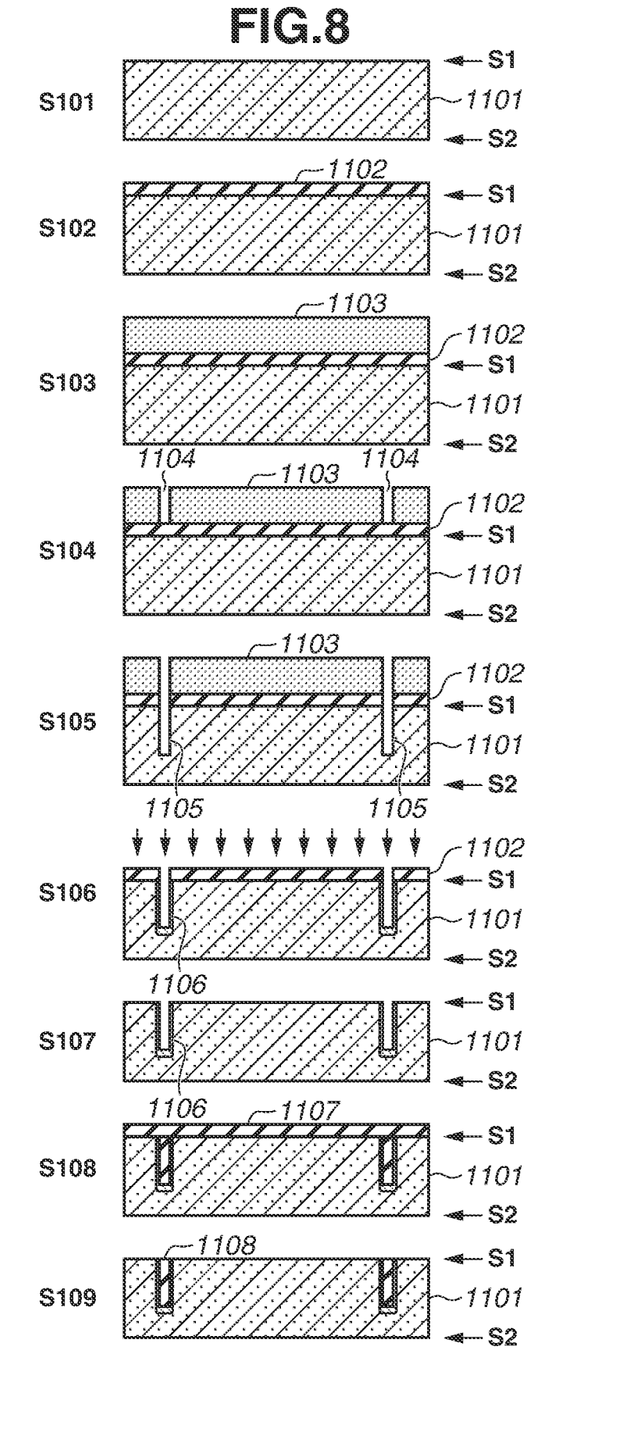
FIG. 8 is a diagram illustrating a manufacturing process for a semiconductor device.

The process of forming the pixel separation portion in a manufacturing process of the image pickup element will be described below with reference to FIG. 8. In step S101, a semiconductor substrate 1101 having a first surface S1 and a second surface S2 that are mutually opposite to each other is prepared. The semiconductor substrate 1101 is typically a silicon substrate or a silicon layer. Subsequently, in step S102, an insulation film (for example, a silicon oxide film) 1102 is formed on the first surface S1 of the semiconductor substrate 1101.

Subsequently, in step S103, a resist 1103 is applied over the first surface S1 of the semiconductor substrate 1101, more specifically, onto the insulation film 1102 on the first surface S1 of the semiconductor substrate 1101. Furthermore, in step S104, the exposure operation is performed as described in the above-mentioned exemplary embodiment, the pattern image is thereby formed in the resist 1103, the etching processing or the like is performed, and thereafter a groove (trench) 1104 is formed.

Subsequently, in step S105, the semiconductor substrate 1101 is etched by a dry etching method or the like, whereby a groove 1105 is formed on the first surface S1 side of the semiconductor substrate 1101.

In this etching, the resist 1103 needs to be applied to be thick to protect the first surface S1 of the semiconductor substrate 1101.

Subsequently, in step S106, the resist 1103 is removed, thereafter ions are implanted into the semiconductor substrate 1101 through the groove 1105, and a gettering area 1106 is thereby formed. That is, in step S106, ions are implanted into the semiconductor substrate 1101 through the groove 1105 in a state where an area of the first surface S1 of the semiconductor substrate 1101 excluding an area in which the groove 1105 is present is masked with the insulation film 1102. The gettering area 1106 can include a first portion that is below a bottom of the groove 1105 and a second portion that is lateral to the groove 1105. As one example, a density of a group 14 element in the first portion is higher than a density of a group 14 element in the second portion.

In a case where the semiconductor substrate 1101 is a silicon substrate, ions can be ions of a group 14 element other than silicon. An ion implantation apparatus is used for ion implantation. Acceleration energy for ion implantation can be determined so as to prevent ions from penetrating the insulation film 1102 as a hard mask and reaching the semiconductor substrate 1101. For example, when the thickness of the insulation film 1102 is 300 nm at the time of ion implantation and acceleration energy is about 20 keV, ions hardly penetrate the insulation film 1102.

In a case where the semiconductor substrate 1101 is the silicon substrate, a material that constitute ions to be implanted into the semiconductor substrate 1101 in step S106 is preferably carbon, but hydrocarbon, which is a molecule including carbon, may be adopted. In a case where the semiconductor substrate 1101 is the silicon substrate, a material that constitutes ions to be implanted into the semiconductor substrate 1101 in step S106 may be germanium, tin, or lead. Implanting ions of carbon, germanium, tin, or lead into the silicon substrate as the semiconductor substrate 1101 gives local distortion to the silicon substrate, and allows the silicon substrate to function as a gettering site. Ion implantation into the semiconductor substrate 1101 through the groove 1105 enables formation of the gettering area 1106 at a deep position of the semiconductor substrate 1101 even with relatively low acceleration energy.

Subsequently, in step S107, the insulation film 1102 is removed. In step S108, an insulation film (for example, silicon nitride film) 1107 is formed in the groove 1105 and on the first surface S1 of the semiconductor substrate 1101 by, for example, a film formation method such as a decompression chemical vapor deposition (CVD) method so that an insulating material is arranged or filled in the groove 1105. Subsequently, in step S109, a portion of the insulation film 1107 that is present on the first surface S1 of the semiconductor substrate 1101 is removed by a chemical mechanical polishing (CMP) method. With this processing, a portion of the insulation film 1107 that is present in the groove 1105 remains as a pixel separation portion 1108 that is arranged or filled in the groove 1105.

Steps S108 and S109 are not necessarily required, and the groove 1105 remains as a gap in a case where steps S108 and S109 are not executed and can function as the pixel separation portion. As the pixel separation portion 1108 arranged in the groove 1105, the groove 1105 need not be completely filled, and there may be a gap in the groove 1105. The pixel separation portion 1108 can be composed only of an insulating material, but can have a structure that combines the insulating material and a non-insulating material (semiconductor or conductor). In this case, to prevent contact between the non-insulating material and the semiconductor substrate 1101, the insulating material can be arranged between the non-insulating material and the semiconductor substrate 1101.

As described above, the pixel separation portion 1108 is formed through a first formation process that forms the groove 1105 in the semiconductor substrate 1101 and a second formation process that forms the pixel separation portion 1108 in the groove 1105. Thereafter, the image-pickup element is configured by formation of a charge accumulation area, a gate electrode, and the like in an area between a plurality of pixel separation portions.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-157909, filed Sep. 28, 2021, which is hereby incorporated by reference herein in its entirety.

What is claimed is:

1. An exposure apparatus configured to expose a substrate to light using an original in which a pattern is formed, the exposure apparatus comprising:
    an illumination optical system configured to guide exposure light to the original, the exposure light including first exposure light with a first wavelength and second exposure light with a second wavelength that is different from the first wavelength;
    an optical projection system that exhibits on-axis chromatic aberration and that is configured to form a pattern image of the original at a plurality of positions in an optical axis direction of the optical projection system using the exposure light; and
    a control unit configured to expose the substrate to light while scanning the substrate in a state where a normal direction of a surface of the substrate is inclined with respect to the optical axis direction of the optical projection system,
    wherein the control unit is configured to adjust parameters regarding both an angle of gradient of the substrate and a difference between the first wavelength and the second wavelength so as to enable a change of a relative ratio between the angle of gradient and the difference.

2. The exposure apparatus according to claim 1, wherein each of the first exposure light and the second exposure light is light with a wavelength that is shifted from a reference wavelength of light that is caused to oscillate from a light source.

3. The exposure apparatus according to claim 1, wherein one of the first exposure light and the second exposure light is light with a wavelength that is shifted from a reference wavelength of light that is caused to oscillate from a light source and the other thereof is light with the reference wavelength.

4. The exposure apparatus according to claim 1, wherein the illumination optical system includes a slit that defines a width of the exposure light in a scanning direction of the substrate.

5. The exposure apparatus according to claim 1, wherein the control unit is configured to expose the substrate to light while scanning the substrate at the angle of gradient of the substrate with respect to a plane that is perpendicular to the optical axis direction, the angle of gradient being determined depending on a width of exposure light that illuminates the substrate in a scanning direction of the substrate.

6. The exposure apparatus according to claim 1, wherein the first wavelength and the second wavelength are determined based on the on-axis chromatic aberration of the optical projection system.

7. The exposure apparatus according to claim 1, wherein the control unit is configured to expose the substrate to light to satisfy the following conditional expression:

$$0.5 \leq (SW \times WT)/(\Delta\lambda \times L) \leq 1.5$$

where SW is a width of exposure light that illuminates the substrate in a scanning direction of the substrate, WT is the angle of gradient of the substrate with respect to a plane that is perpendicular to the optical axis direction, $\Delta\lambda$ is the difference between the first wavelength and the second wavelength, and L is the on-axis chromatic aberration of the optical projection system.

8. The exposure apparatus according to claim 7, the control unit is configured to expose the substrate to light so as to satisfy the following conditional expression:

$$(SW \times WT)/(\Delta\lambda \times L) = 1.$$

9. The exposure apparatus according to claim 1, wherein, in a case where SW is a width of exposure light that illuminates the substrate in a scanning direction of the substrate, WT is the angle of gradient of the substrate with respect to a plane that is perpendicular to the optical axis direction, $\Delta\lambda$ is the difference between the first wavelength and the second wavelength, and L is the on-axis chromatic aberration of the optical projection system, the control unit is configured to control WT or $\Delta\lambda$ to expose the substrate to light so as to adjust a difference between (SW×WT) and ($\Delta\lambda$×L).

10. An exposure method of exposing a substrate to light using an exposure apparatus that includes an illumination optical system configured to illuminate an original in which a pattern is formed and an optical projection system that exhibits on-axis chromatic aberration and that is configured to form an image of the pattern at a plurality of positions in an optical axis direction of the optical projection system, the method comprising:
  exposing the substrate to light while scanning the substrate in a state where a normal direction of a surface of the substrate is inclined with respect to the optical axis direction of the optical projection system, using exposure light that includes first exposure light with a first wavelength and second exposure light with a second wavelength that is different from the first wavelength; and
  adjusting a parameter regarding both an angle of gradient of the substrate and a difference between the first wavelength and the second wavelength so as to enable a change of a relative ratio between the angle of gradient and the difference.

11. A manufacturing method for a semiconductor device, the method comprising:
  first formation of forming a groove in a substrate; and
  second formation of forming a pixel separation portion in the groove,
  wherein the first formation includes exposing the substrate to light using an exposure apparatus that includes an illumination optical system configured to illuminate an original in which a pattern is formed and an optical projection system that exhibits on-axis chromatic aberration and that is configured to form an image of the pattern at a plurality of positions in an optical axis direction of the optical projection system, and
  wherein the exposing includes exposing the substrate to light while scanning the substrate in a state where a normal direction of a surface of the substrate is inclined with respect to the optical axis direction of the optical projection system, using exposure light that includes first exposure light with a first wavelength and second exposure light with a second wavelength that is different from the first wavelength.

12. A manufacturing method for a product comprising:
  exposing a substrate to light using an exposure apparatus that includes an illumination optical system configured to illuminate an original in which a pattern is formed and an optical projection system that exhibits on-axis chromatic aberration and that is configured to form an image of the pattern at a plurality of positions in an optical axis direction of the optical projection system;
  performing development on the substrate that has been exposed to light; and
  processing the substrate on which the development has been performed to obtain a product,
  wherein the exposing includes exposing the substrate to light while scanning the substrate in a state where a normal direction of a surface of the substrate is inclined with respect to the optical axis direction of the optical projection system, using exposure light that includes first exposure light with a first wavelength and second exposure light with a second wavelength that is different from the first wavelength, and
  wherein parameters regarding both an angle of gradient of the substrate and a difference between the first wavelength and the second wavelength is adjusted so as to enable a change of a relative ratio between the angle of gradient and the difference.

* * * * *